United States Patent
Rubin et al.

(10) Patent No.: US 8,293,568 B2
(45) Date of Patent: Oct. 23, 2012

(54) CRYSTALLINE SILICON PV CELL WITH SELECTIVE EMITTER PRODUCED WITH LOW TEMPERATURE PRECISION ETCH BACK AND PASSIVATION PROCESS

(75) Inventors: Leonid B. Rubin, Burnaby (CA); Bram Sadlik, Vancouver (CA); Alexander Osipov, New Westminster (CA)

(73) Assignee: Day4 Energy Inc., Burnaby, BC (CA)

( * ) Notice: Subject to any disclaimer, the term of this patent is extended or adjusted under 35 U.S.C. 154(b) by 0 days.

(21) Appl. No.: 13/056,594

(22) PCT Filed: Jul. 28, 2008

(86) PCT No.: PCT/CA2008/001391
§ 371 (c)(1),
(2), (4) Date: Apr. 22, 2011

(87) PCT Pub. No.: WO2010/012062
PCT Pub. Date: Feb. 4, 2010

(65) Prior Publication Data
US 2011/0189810 A1 Aug. 4, 2011

(51) Int. Cl.
*H01L 21/00* (2006.01)
(52) U.S. Cl. .......................................................... 438/98
(58) Field of Classification Search .................... 438/98, 438/549
See application file for complete search history.

(56) References Cited

U.S. PATENT DOCUMENTS

| | | |
|---|---|---|
| 3,982,964 A | 9/1976 | Lindmayer et al. |
| 3,996,067 A | 12/1976 | Broder |
| 4,027,652 A | 6/1977 | Collura |
| 4,080,703 A | 3/1978 | Beck, Jr. |
| 4,163,194 A | 7/1979 | Ross |
| 4,173,496 A | 11/1979 | Chiang et al. |
| 4,200,472 A | 4/1980 | Chappell et al. |

(Continued)

FOREIGN PATENT DOCUMENTS

DE 3927947 A1 2/1991

(Continued)

OTHER PUBLICATIONS

International Search Report dated Nov. 21, 2008, for International Application No. PCT/CA2008/001391.

(Continued)

*Primary Examiner* — Charles Garber
*Assistant Examiner* — Andre' C Stevenson
(74) *Attorney, Agent, or Firm* — Knobbe, Martens, Olson & Bear, LLP (57) ABSTRACT

A method of forming a selective emitter in a photovoltaic (PV) crystalline silicon semiconductor wafer involves forming a mask on a front side surface of the wafer to create masked and unmasked areas on the front side surface. A first silicon oxide layer is electrochemically formed at the unmasked areas of the front side surface such that the silicon oxide layer extends into an emitter of the wafer at least as far as a dead zone therein. The mask is removed and the first silicon oxide layer is etched back until substantially all of the first silicon oxide layer is removed. A second silicon oxide layer is then electrochemically formed on the front side surface such that the second silicon oxide layer has sufficient thickness to passivate the front side surface.

27 Claims, 6 Drawing Sheets

U.S. PATENT DOCUMENTS

| | | | |
|---|---|---|---|
| 4,242,696 | A | 12/1980 | Diguet et al. |
| 4,256,513 | A | 3/1981 | Yoshida et al. |
| 4,278,473 | A | 7/1981 | Borden |
| 4,291,191 | A | 9/1981 | Dahlberg |
| 4,315,096 | A | 2/1982 | Tyan et al. |
| 4,320,154 | A | 3/1982 | Biter |
| 4,330,680 | A | 5/1982 | Goetzberger |
| 4,341,918 | A | 7/1982 | Evans, Jr. et al. |
| 4,376,872 | A | 3/1983 | Evans et al. |
| 4,380,112 | A | 4/1983 | Little |
| 4,443,653 | A | 4/1984 | Catalano et al. |
| 4,499,658 | A | 2/1985 | Lewis |
| 4,517,403 | A | 5/1985 | Morel et al. |
| 4,603,470 | A | 8/1986 | Yamazaki |
| 4,628,144 | A | 12/1986 | Burger |
| 4,667,060 | A | 5/1987 | Spitzer |
| 4,697,041 | A | 9/1987 | Okaniwa et al. |
| 4,703,553 | A | 11/1987 | Mardesich |
| 4,735,662 | A | 4/1988 | Szabo et al. |
| 4,933,021 | A | 6/1990 | Swanson |
| 4,993,021 | A | 2/1991 | Nannicini et al. |
| 5,009,720 | A | 4/1991 | Hokuyo et al. |
| 5,011,567 | A | 4/1991 | Gonsiorawski |
| 5,078,803 | A | 1/1992 | Pier et al. |
| 5,084,107 | A | 1/1992 | Deguchi et al. |
| 5,158,618 | A | 10/1992 | Rubin et al. |
| 5,164,019 | A | 11/1992 | Sinton |
| 5,223,044 | A | 6/1993 | Asai |
| 5,248,347 | A | 9/1993 | Ochi |
| 5,330,583 | A | 7/1994 | Asai et al. |
| 5,389,158 | A | 2/1995 | Fraas et al. |
| 5,391,236 | A | 2/1995 | Krut et al. |
| 5,457,057 | A | 10/1995 | Nath et al. |
| 5,474,620 | A | 12/1995 | Nath et al. |
| 5,491,427 | A | 2/1996 | Ueno et al. |
| 5,498,297 | A | 3/1996 | O'Neill |
| 5,543,726 | A | 8/1996 | Boyette, Jr. et al. |
| 5,543,729 | A | 8/1996 | Henley |
| 5,616,185 | A | 4/1997 | Kukuika |
| 5,651,837 | A | 7/1997 | Ohtsuka et al. |
| 5,681,402 | A | 10/1997 | Ichinose et al. |
| 5,759,291 | A | 6/1998 | Ichinose et al. |
| 5,871,591 | A | 2/1999 | Ruby et al. |
| 5,899,704 | A * | 5/1999 | Schlosser et al. ............... 438/98 |
| 5,909,124 | A | 6/1999 | Madine et al. |
| 5,942,048 | A | 8/1999 | Fujisaki et al. |
| 5,990,415 | A | 11/1999 | Green et al. |
| 6,034,322 | A | 3/2000 | Pollard |
| 6,077,091 | A | 6/2000 | McKenna-Olson et al. |
| 6,091,021 | A | 7/2000 | Ruby et al. |
| 6,093,882 | A | 7/2000 | Arimoto |
| 6,121,542 | A | 9/2000 | Shiotsuka et al. |
| 6,144,216 | A | 11/2000 | Kajiwara et al. |
| 6,172,297 | B1 | 1/2001 | Hazel et al. |
| 6,184,458 | B1 | 2/2001 | Murakami et al. |
| 6,248,948 | B1 | 6/2001 | Nakagawa et al. |
| 6,344,736 | B1 | 2/2002 | Kerrigan et al. |
| 6,379,995 | B1 | 4/2002 | Kawama et al. |
| 6,384,313 | B2 | 5/2002 | Nakagawa et al. |
| 6,441,297 | B1 | 8/2002 | Keller et al. |
| 6,452,086 | B1 | 9/2002 | Müller |
| 6,541,695 | B1 | 4/2003 | Mowles |
| 6,552,414 | B1 | 4/2003 | Horzel et al. |
| 6,620,645 | B2 | 9/2003 | Chandra et al. |
| 6,663,944 | B2 | 12/2003 | Park et al. |
| 6,690,041 | B2 | 2/2004 | Armstrong et al. |
| 6,741,087 | B2 | 5/2004 | Kimura et al. |
| 6,756,290 | B1 | 6/2004 | Bultman |
| 6,784,358 | B2 | 8/2004 | Kukulka |
| 6,803,513 | B2 | 10/2004 | Beernink et al. |
| 6,806,414 | B2 | 10/2004 | Shiotsuka et al. |
| 6,807,059 | B1 | 10/2004 | Dale |
| 6,825,104 | B2 | 11/2004 | Horzel et al. |
| 6,982,218 | B2 | 1/2006 | Preu et al. |
| 7,030,410 | B2 | 4/2006 | Moore |
| 7,087,834 | B2 | 8/2006 | McFarland |
| 7,115,504 | B2 | 10/2006 | Moore et al. |
| 7,196,459 | B2 | 3/2007 | Morris |
| 7,239,161 | B2 | 7/2007 | Iwanaga et al. |
| 7,271,333 | B2 | 9/2007 | Fabick et al. |
| 7,432,438 | B2 | 10/2008 | Rubin et al. |
| 7,704,866 | B2 * | 4/2010 | Vanheusden et al. ......... 438/533 |
| 2001/0007262 | A1 | 7/2001 | Matsushita et al. |
| 2001/0009159 | A1 | 7/2001 | Watanabe et al. |
| 2002/0062828 | A1 | 5/2002 | Nydahl et al. |
| 2002/0153039 | A1 | 10/2002 | Moon et al. |
| 2002/0164834 | A1 | 11/2002 | Boutros et al. |
| 2003/0000568 | A1 | 1/2003 | Gonsiorawski |
| 2003/0134469 | A1 | 7/2003 | Horzel et al. |
| 2004/0016456 | A1 | 1/2004 | Murozono et al. |
| 2004/0089339 | A1 | 5/2004 | Kukulka et al. |
| 2004/0112426 | A1 | 6/2004 | Hagino |
| 2004/0123897 | A1 | 7/2004 | Ojima et al. |
| 2004/0248336 | A1 | 12/2004 | Shimizu |
| 2005/0087224 | A1 | 4/2005 | McFarland |
| 2005/0172996 | A1 | 8/2005 | Hacke et al. |
| 2005/0241692 | A1 | 11/2005 | Rubin et al. |
| 2005/0257453 | A1 | 11/2005 | Cinnamon |
| 2006/0022192 | A1 | 2/2006 | Brabec et al. |
| 2006/0103371 | A1 | 5/2006 | Manz |
| 2006/0130891 | A1 | 6/2006 | Carlson |
| 2006/0255340 | A1 | 11/2006 | Manivannan et al. |
| 2007/0068567 | A1 | 3/2007 | Rubin |
| 2007/0095386 | A1 | 5/2007 | Gibson |
| 2007/0102038 | A1 | 5/2007 | Kirschning |
| 2007/0137692 | A1 | 6/2007 | Carlson |
| 2007/0144577 | A1 | 6/2007 | Rubin |
| 2008/0035198 | A1 | 2/2008 | Teppe et al. |
| 2008/0072951 | A1 | 3/2008 | Gabor |
| 2008/0092944 | A1 | 4/2008 | Rubin |
| 2008/0290368 | A1 | 11/2008 | Rubin |
| 2009/0025778 | A1 | 1/2009 | Rubin |
| 2009/0025788 | A1 | 1/2009 | Rubin |
| 2009/0205705 | A1 | 8/2009 | Brendel et al. |
| 2009/0211628 | A1 | 8/2009 | Engelhart et al. |
| 2010/0147368 | A1 | 6/2010 | Rubin |
| 2010/0275976 | A1 | 11/2010 | Rubin et al. |

FOREIGN PATENT DOCUMENTS

| | | |
|---|---|---|
| DE | 29720377 U1 | 5/1998 |
| DE | 19741832 A1 | 3/1999 |
| DE | 19752678 A1 | 6/1999 |
| DE | 19757150 A1 | 6/1999 |
| DE | 10132113 A1 | 3/2002 |
| DE | 10239845 C1 | 12/2003 |
| DE | 102004050269 A1 | 4/2006 |
| DE | 102004053873 A1 | 5/2006 |
| DE | 102004061604 A1 | 6/2006 |
| DE | 102005001379 A1 | 7/2006 |
| DE | 102005040871 A1 | 10/2006 |
| DE | 102006013313 A1 | 9/2007 |
| DE | 102006009112 A1 | 2/2008 |
| DE | 102007011749 A1 | 3/2008 |
| DE | 102006047579 A1 | 4/2008 |
| DE | 102007003682 A1 | 8/2008 |
| DE | 102007035883 A1 | 2/2009 |
| DE | 102007054384 A1 | 5/2009 |
| DE | 102007059486 A1 | 6/2009 |
| DE | 102007059490 A1 | 6/2009 |
| DE | 102008030880 A1 | 6/2009 |
| DE | 102008013068 A1 | 9/2009 |
| DE | 102008015157 A1 | 9/2009 |
| EP | 0542478 | 3/1996 |
| EP | 0807980 A2 | 11/1997 |
| EP | 0905794 A2 | 3/1999 |
| EP | 2019433 | 1/2009 |
| JP | 59-115576 A | 7/1984 |
| JP | 01-206671 A | 2/1988 |
| JP | 07-321351 A | 12/1995 |
| JP | 2000-243990 | 9/2000 |
| JP | 2005-191479 | 7/2005 |
| WO | WO 03/107021 | 12/2003 |
| WO | WO 2004/021455 A1 | 3/2004 |
| WO | WO 2006/042698 A1 | 4/2006 |
| WO | WO 2006/048319 A2 | 5/2006 |
| WO | WO 2006/111304 A1 | 10/2006 |
| WO | WO 2006/123938 A1 | 11/2006 |

| | | | |
|---|---|---|---|
| WO | WO 2007/071064 A1 | 6/2007 |
| WO | WO 2007/107339 A1 | 9/2007 |
| WO | WO 2009/062882 A2 | 5/2009 |
| WO | WO 2009/074466 A1 | 6/2009 |
| WO | WO 2009/074468 A2 | 6/2009 |
| WO | WO 2009/074469 A2 | 6/2009 |

OTHER PUBLICATIONS

A translation of an Official Action mailed on Jun. 2, 2009 in connection with the Japanese Patent Application No. 2004-531327. This Japanese application corresponds to the subject U.S. Appl. No. 12/246,498.

Burgers et al, Interruption Tolerance of Metallization Patterns, Proc. of the 12th European Phovoltaic Solar Energy Conference, Apr. 11-15, 1994, Amsterdam, The Netherlands.

Gee, James M. et al., "Emitter wrap-through solar cell," Sandia National Laboratories, Albuquerque, New Mexico, pp. 265-270.

H.A.L.M. Electronik, "cetisPV-Contact1 Contacting Station for Solar Cells", http://www.halm.de/English/Prospekte/Pvcontact/cetisPVContact1_main.html.

Hammud et al., "Monolithically Series-Connected Crystalline SI Wafer Cells for Portable Electronic Devices", 31st IEEE Photovoltaic Specialists Conference 2005, IEEE Catalog No. 05CH37608C; ISBN 0-7803-8708-5.

Hoornstra et al., "The Importance of Paste Rheology in Improving the Fine Line, Thick Film Screen Printing of Front Side Metallization," Proc. of the 14th European Phovoltaic Solar Energy Conference, Jun. 30-Jul. 4, 1997, Barcelona Spain.

http://www.inspira.es/newroom.981130.html.

http://www.sandia.gov/pv/docs/PVFarraysConcentrator_Collectors.htm.

http://www.spectrolab.com/DataSheets/TerCel/PV_Concentrator_Module.pdf.

International Search Report and Written Opinion dated Jul. 8, 2011, for PCT/CA2010/001664.

International Search Report dated Sep. 8, 2008, for PCT/CA2007/002301.

Notice of Abandonment in U.S. Appl. No. 11/751,524, dated Jun. 22, 2011.

Notice of Allowance in U.S. Appl. No. 12/246,498, dated May 12, 2011.

Notice of Allowance in U.S. Appl. No. 12/246,498, dated May 2, 2011.

Official Communication in Korean Patent Application No. 520050056406 dated Apr. 27, 2010.

Raabe et al., High Aspect Ratio Screen Printed Fingers, Proc. of the 20th European Photovoltaic Solar Energy Conference, Jun. 6-10, 2005, Barcelona, Spain.

Rohatgi et al., "Self-aligned self-doping selective emitter for screen printed solar cells", Photovoltaics Conference Papers, 2001.

Rubin et al., "one-Axis PV Sun Concentrator Based on Linear Nonimaging Fresnel Lens", International Conference on Solar Concentrators for the Generation of Electricity or Hydrogen, May 1-5, 2005, Scottsdale, Arizona, USA.

Van Kerschaver, Emmanuel et al., "Back-contact solar cells: A review," Progress in Photovoltaics: Research and Applications, 2006, vol. 14, pp. 107-123, published online Dec. 20, 2005, in Wiley InterScience (www.interscience.wiley.com) DOI: 10.1002/pip.657.

Vasu et al., "Photovoltaic properties of indium tin ovide/silicon junctions", Semiconductor Science & Technology, 1992.

Website, "Wiring solar modules and batteries," http://www.partsonsale.com/learnwiring.htm from Feb. 6, 2003, available from www.archive.org. 4 Pages.

* cited by examiner

CRYSTALLINE SILICON PV CELL WITH SELECTIVE EMITTER PRODUCED WITH LOW TEMPERATURE PRECISION ETCH BACK AND PASSIVATION PROCESS

This application is the U.S. National Phase of International Application PCT/CA2008/001391, filed Jul. 28, 2008, designating the U.S. and published in English as WO/2010/012062 on Feb. 4, 2010.

BACKGROUND OF THE INVENTION

1. Field of Invention

The present invention generally relates to semiconductor devices and more particularly to highly efficient photovoltaic (PV) cells with selective emitters.

2. Description of Related Art

A crystalline silicon photovoltaic (PV) cell typically has a front side surface operable to receive light and a back side surface opposite the front side surface. The front side surface is part of an emitter of the PV cell and has a plurality of electrical contacts formed therein. The back side surface has at least one electrical contact. The electrical contacts on the front and back sides are used to connect the PV cell to an external electrical circuit.

The front side contacts are typically formed as a plurality of parallel spaced apart "fingers" that extend across the entire front side surface. The fingers are formed by screen printing a metallic paste onto the front side surface in a desired pattern. The metallic paste is diffused into the front side surface such that only a small portion of the paste is left on the front side surface and this small portion is seen as the fingers or above described lines. Additional paste may be provided to create bus bars that extend at right angles to the fingers, to collect electric current from the fingers. The bus bars are typically wider than the fingers to enable them to carry the current collected from the fingers.

The electrical contacts and bus bars are opaque and shade the emitter from light, which reduces the effective emitter area available for light gathering. As a result, the area that is occupied by the screen printed fingers and bus bars on the front side of the substrate is known as the shading area because the opaque paste that forms the fingers and bus bars prevents solar radiation from reaching the emitter in this area. The shading area reduces the current producing capacity of the device. Modern solar cell substrate shading areas occupy 6% to 10% of the available active surface area.

Although silicon crystalline cells are produced in large volumes, there exists a need to increase their efficiency and decrease their production cost in order to make photovoltaic energy cost competitive. Optimization of front side metallization is one way to decrease the shading area that is occupied by metallic contacts. A decrease in shading area increases the electric current and voltage of a PV cell since it increases the surface area of the substrate that is reached by solar radiation and it also reduces the diffusion of the contact paste into the front surface of the substrate, the diffusion having a detrimental effect on charge recombination. Charge recombination on front and back sides of PV cells may be substantially reduced by passivation with thin layer dielectric materials, such as for example $SiO_2$, $SiN_x$, SiC by employing industrially available technologies and equipment (S. W. Glunz et. al., "Comparison of different dielectric passivation layers for application in industrially feasible high-efficiency crystalline solar cells" presented at the 20th European Solar Conference and Exhibition, 6-10 Jun., 2005, Barcelona).

Conventional screen printing technology imposes limitations on solar cell efficiency improvements due to a restriction on emitter thickness. When the emitter thickness is less than a diffusion depth of the metallic paste during the screen printed fingers firing process, electrical shunting through the p/n junction occurs. Therefore modern screen printing technology allows the production of solar cells with emitter sheet resistance of typically no more than 65 Ohm/sq. This corresponds to an emitter thickness of greater than 0.2 micrometers. At the same time it is known that an emitter with a sheet resistance of greater than 100 Ohm/sq sheet resistivity and thickness of less than 0.2 micrometers provides a substantial gain in cell efficiency mainly due to lower optical losses in the blue spectral region. An emitter with these properties is known as a shallow emitter. Thus, in order to increase the conversion efficiency of solar cells that employ a conventional screen printed metallization, emitter design parameters may be optimized such that under a screen printed finger, an emitter thickness is sufficiently high while in light-illuminated areas, the emitter thickness is substantially thinner. An emitter with these differing thicknesses is known as a selective emitter. In a selective emitter, sufficient emitter thickness and high dopant concentration in areas under current collecting fingers and bus bars ensures low resistance electrical contacts between the semiconductor substrate and the fingers and bus bars without shunting the p/n junction. Although the use of a selective emitter has proved to be effective in improving PV cell efficiency, implementation of a selective emitter in practice, is quite complicated.

Another approach to improving solar cell performance comprises etching back a dead zone of the emitter, leaving only a zone of decreasing dopant concentration in the emitter. A dead zone, or zone of relatively constant dopant concentration is formed in semiconductor material when a dopant is diffused into the material. A zone of decreasing dopant concentration is formed immediately adjacent the dead zone. The dead zone has a relatively high dopant concentration. In this zone, recombination of electric charges occur quite readily, which is undesirable. Therefore it is common in the art to try to remove this zone using conventional etching methods, to leave only the zone of decreasing dopant concentration. Conventional etch back methods are based on wet etching or plasma etching processes that involve high temperatures, which require expensive equipment and special procedures and not compatible with multi crystalline silicon semiconductor material. Moreover, these methods can result in partial thinning of the zone of decreasing concentration. As a result, the thickness of the emitter cannot be accurately controlled and thus manufacturing tolerances are difficult to achieve in production.

U.S. Pat. No. 5,871,591 entitled "Silicon solar cells made by a self-aligned, selective-emitter, plasma-etchback process" to Ruby et al. describes a process for forming and passivating a selective emitter. The process uses a plasma etch of a heavily doped emitter to improve its performance. Screen printed metallic patterns, also referred to as grids of the solar cell, are used to mask a plasma etch such that only regions of the emitter between the grids are etched, while regions beneath the grids remain heavily doped to provide low contact resistance between the substrate and the screen printed metallic grids. The process is potentially a low-cost process because it does not require precision alignment of heavily doped regions with screen printed patterns. After the emitter is etched, silicon nitride is deposited by plasma-enhanced chemical vapor deposition, to provide creating an antireflection coating. The solar cell is then annealed in a forming gas. The proposed plasma etchback method provides for a substantial decrease in dopant concentration on the emitter surface which improves an emitter doping profile and provides a corresponding improvement in solar cell efficiency due to reduced surface charge recombination. While this method allows fabrication of a selective emitter and an increase in solar cell efficiency, it has the disadvantage that it is unable to provide sufficient control over the final thickness of the emitter after etchback processing. This disadvantage results in poor reproducibility of properties of the produced PV cells.

U.S. Pat. No. 6,091,021 entitled "Silicon solar cells made by a self-aligned, selective-emitter, plasma-etchback process" to Ruby et al. describes PV cells and a method for making the PV cells wherein metallized grids of the PV cells are used to mask portions of PV cell emitter regions to allow selective etching of the regions. Self-aligned selective etching allows for an enhanced blue response as compared to PV cells with uniform heavy doping of the emitter, while preserving heavier doping in the regions beneath the gridlines, as is needed for low contact resistance. The method may replace difficult alignment methodologies used to obtain selectively etched emitters, and may be easily integrated with existing plasma processing methods and techniques.

The method provides for a substantial decrease in a doping concentration on the emitter surface which improves the emitter doping profile and provides a corresponding improvement in solar cell efficiency due to reduced surface charge recombination. However, again, the proposed method is unable to provide sufficient control over the final thickness of the emitter after the etchback processing resulting in poor reproducibility of properties of the produced PV cells.

U.S. Pat. Nos. 6,552,414 and 6,825,104 both entitled "Semiconductor device with selectively diffused regions" to Horzel et al. describe a PV cell having two selectively diffused regions with different doping levels. A first screen printing process is used to deposit a solid based dopant source onto a substrate. Diffusion of dopant atoms from the dopant source into the front side of the solar cells is arranged in a specially provided atmosphere to produce two areas with different dopant concentrations: a high dopant concentration area under the dopant source, and a low dopant concentration area on the rest of the solar cell's front side. A second screen printing process deposits a metallization pattern that is precisely aligned to ensure that screen printed fingers and bus bars are in electrical contact with the high dopant concentration areas of the emitter. However, with these methods, it is very difficult to ensure sufficient reproducibility of the properties of the emitter, especially the thickness of the selective shallow emitter region.

SUMMARY OF THE INVENTION

In accordance with one aspect of the invention there is provided a method of forming a selective emitter in a photovoltaic crystalline silicon semiconductor wafer having front and back side surfaces, a junction between the front and back side surfaces, and an emitter between the junction and the front side surface. The emitter has a diffused dopant concentration profile such that the emitter has a dead zone immediately underneath the front side surface in which the diffused dopant concentration is relatively constant and a zone of decreasing dopant concentration adjacent the dead zone in which the diffused dopant concentration is decreasing. The method involves forming a mask on the front side surface, to create masked and unmasked areas on the front side surface. The method further involves electrochemically forming a first silicon oxide layer at the unmasked areas of the front side surface such that the silicon oxide layer extends into the emitter at least as far as the dead zone. The method further involves removing the mask, etching back the first silicon oxide layer until substantially all of the first silicon oxide layer is removed, and electrochemically forming a second silicon oxide layer on the front side surface after etching back, such that the second silicon oxide layer has sufficient thickness to passivate the front side surface.

Electrochemically forming at least one of the first silicon oxide layer and the second silicon oxide layer may involve placing the front side surface in electrical contact with a surface of an electrolyte while applying an electric potential between the electrolyte and the back side surface of the wafer until a current through the wafer meets a criterion.

Electrochemically forming at least one of the first silicon oxide layer and the second silicon oxide layer may involve applying the electric potential until the current through the wafer is less than a reference value.

Electrochemically forming the first silicon oxide layer may involve setting the reference value at a value corresponding to a thickness of the silicon oxide layer corresponding to approximately a thickness of at least the dead zone.

Electrochemically forming at least one of the first silicon oxide layer and the second silicon oxide layer may involve varying the electric potential as the first silicon oxide layer and/or the second silicon oxide layer grows.

Varying the electric potential may involve varying the electric potential between about 20 volts to about 500 volts.

Electrochemically forming the first silicon oxide layer may involve electrochemically forming the first silicon oxide layer until the first silicon oxide layer has a thickness of between about 1 nm to about 500 nm and wherein forming the second silicon oxide layer comprises electrochemically forming the second silicon oxide layer until the second silicon oxide layer has a thickness of between about 1 nm to about 30 nm.

In accordance with another aspect of the invention there is provided a method of preparing a photovoltaic crystalline silicon semiconductor wafer for use as a photovoltaic cell. The method may involve applying an antireflective coating to the front side surface after the second oxide layer has been formed.

The method may further involve forming electrical contacts on the front and back side surfaces, wherein the electrical contacts formed in the front side surface are formed in areas of the semiconductor wafer that were covered by the mask and the electrical contacts formed in the back side surface are formed uniformly throughout the back side surface.

Forming the mask may involve printing a paste onto the front side surface.

Printing a paste may involve printing the paste into lines.

The method may further involve forming electrical contacts on the front and back side surfaces after the antireflective coating has been formed, wherein the electrical contacts formed in the front side surface are formed in areas of the emitter that were covered by the mask and the electrical contacts formed in the back side surface are formed uniformly throughout the back side surface.

In accordance with another aspect of the invention, there is provided a method of forming a selective emitter in a crystalline silicon semiconductor wafer having front and back side surfaces. The method involves forming a mask on the front side surface, to create masked and unmasked areas on the front side surface. The method further involves electrochemically forming a first silicon oxide layer in the unmasked areas of the front side surface and removing the mask. The method further involves diffusing a dopant through the previously masked areas of the front side surface and through the first silicon oxide layer such that the previously masked areas and the first silicon oxide layer have a dead zone in which the diffused dopant concentration is relatively constant and a zone of decreasing dopant concentration adjacent the dead zone in which the diffused dopant concentration is decreasing. The method further involves etching back the silicon oxide layer until substantially all of the first silicon oxide layer is removed. The method further involves electrochemically forming a second silicon oxide layer on the front side surface after the etching back, the second silicon oxide layer having sufficient thickness to passivate the front side surface.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

In drawings which illustrate embodiments of the invention,

FIG. 1 is a schematic diagram representing a process for forming a selective emitter in a photovoltaic crystalline silicon semiconductor wafer, according to a first embodiment of the invention and comprises FIG. 1A which is a schematic representation of a starting material for the process;

FIG. 6 is a schematic representation of a process for forming a selective emitter in a photovoltaic crystalline silicon semiconductor wafer in which a p/n junction has not yet been formed and includes FIG. 6A which depicts a first step of the process in which protective strips are screen printed onto a pre-doped p-type semiconductor wafer;

DETAILED DESCRIPTION

Referring to FIG. 1, a method of forming a selective-emitter in a photovoltaic crystalline silicon semiconductor wafer, according to a first embodiment of the invention, is shown generally at 10. As shown in FIG. 1A, the starting material for the method is a photovoltaic crystalline silicon semiconductor wafer 12 having front and back side surfaces 14 and 16 and a semiconductor p/n junction 18 between the front and back side surfaces.

Figure 1A:
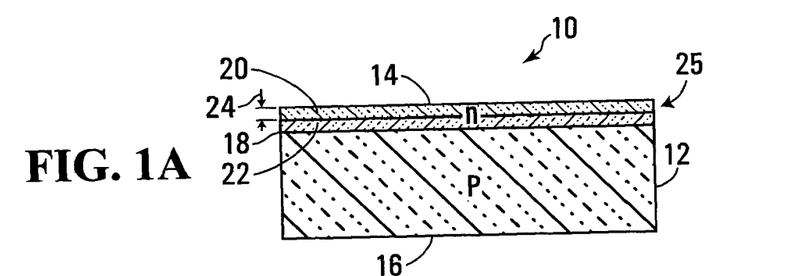

Initially, the wafer is made from semiconductor material doped in the usual manner wherein, for example, a bulk portion of the wafer is comprised of p-type material and an emitter portion of the wafer is comprised of n-type material. The emitter is located between the junction 18 and the front side surface 14.

Typically, the emitter is formed by diffusing phosphorus into the p-type semiconductor wafer. The diffusion process used to diffuse the phosphorus into the wafer results in diffusion of dopant through the front side surface 14 into the bulk semiconductor, and this creates the emitter and causes it to have a diffused dopant concentration profile such that the emitter has a dead zone 20 immediately underneath the front side surface and a zone of decreasing concentration 22 between the dead zone and the junction 18. The dead zone 20 has a electrically active dopant concentration that is relatively constant from the front side surface 14 to a first distance 24 from the front side surface and the zone of decreasing concentration 22 has a decreasing dopant concentration in which the diffused dopant concentration is decreasing, from the first distance to the junction 18. Typically, an emitter formed by the usual dopant diffusion process described above, produces an emitter having a sheet resistivity of approximately 40 to 50 ohms per square and an emitter thickness in the range of about 0.3 to about 0.5 microns.

Figure 1B:
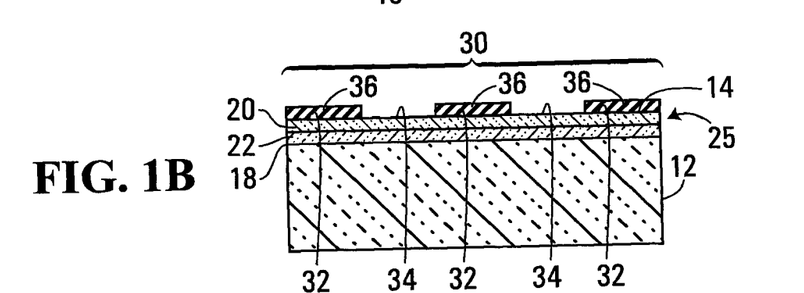
FIG. 1B which is a schematic representation of the device of FIG. 1A after protective strips have been formed on a front surface thereof.

Referring to FIG. 1B, the first step in the process, according to a first embodiment of the invention, is to form a mask 30 on the front side surface 14 to create masked areas 32 and unmasked areas 34 on the front side surface. In the embodiment shown, the mask 30 is formed by the deposition of protective strips 36 on the front side surface 14 using screen-printing or inkjet technology. For example, picein wax or other wax-based hot-melt paste suitable to protect the emitter surface from electrochemical oxidation and stable against hydrofluoric acid are desirable. Suitable products for this purpose are available from Ferro Corporation of Ohio, USA, for example.

Figure 2:
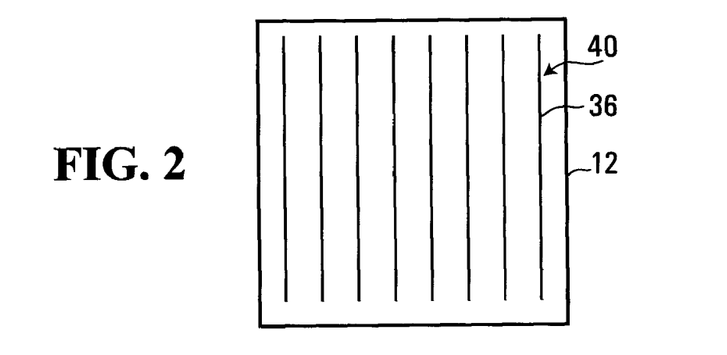
FIG. 2 is a schematic representation of the device shown in FIG. 1B wherein the protective strips are printed in parallel lines across a front side surface of the device shown in FIG. 1B.

Referring to FIG. 2, the protective strips 36 may be arranged in parallel continuous lines 40 across the front side surface 14, each line having a width of about 100 micrometers to about 500 micrometers. The lines may be spaced apart by about 500 micrometers to about 5000 micrometers.

Figure 3:
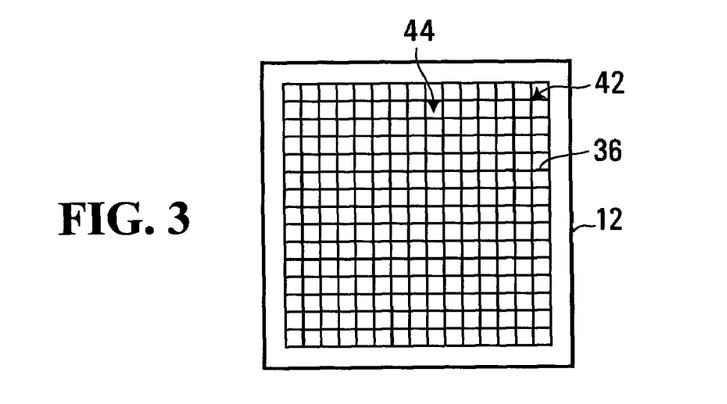
FIG. 3 is a schematic representation of the device shown in FIG. 1B wherein the protective strips are formed in a square grid pattern.

Referring to FIG. 3, alternatively, the protective strips 36 may be arranged into a square grid arrangement 42 having meshes 44 of about 500 micrometers to about 5000 micrometers square.

Figure 4:
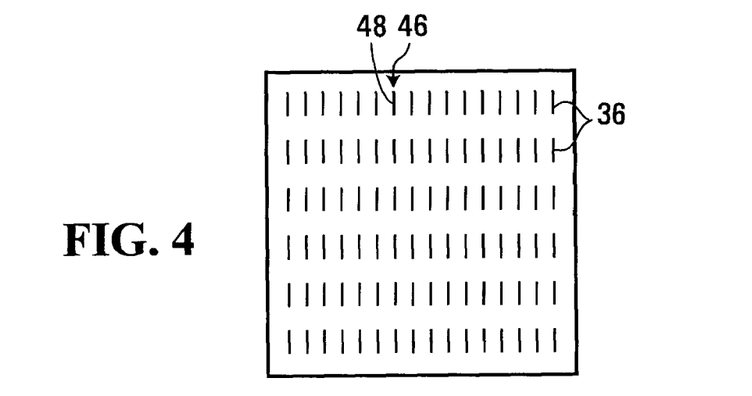
FIG. 4 is a schematic representation of the device shown in FIG. 1B wherein the protective strips are formed in broken line segments.

Referring to FIG. 4, in another alternative embodiment, the protective strips 36 may be arranged in parallel broken lines 46 comprising a plurality of line segments 48, each segment having a length of between about 0.5 mm to about 4 mm and a width of between about 0.1 mm to about 1 mm. These broken lines 46 may be spaced apart between about 1 mm to about 6 mm, for example.

Figure 1C:
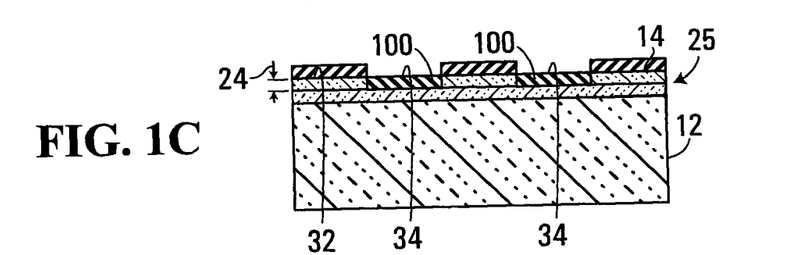
FIG. 1C which is a schematic representation of the device of FIG. 1B after electrochemical formation of a first silicon oxide layer thereon.

Referring to FIG. 1C, the second step in the process is to electrochemically form a first silicon oxide layer 100 at the un-masked areas 34 of the front side surface 14 such that the first silicon oxide layer extends into the emitter 25 at least as far as the first distance 24 defining the end of the dead zone 20.

Figure 5:
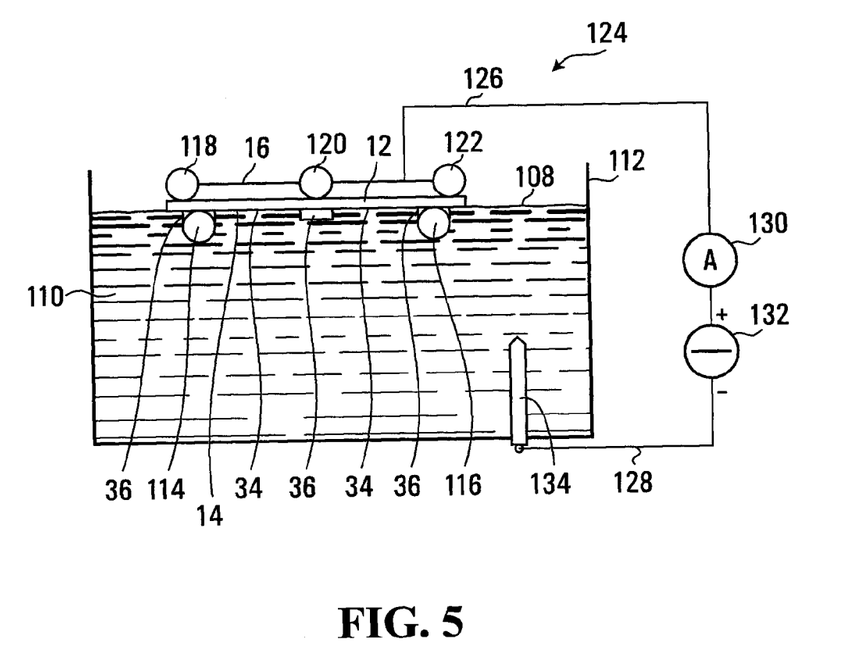
FIG. 5 is a schematic representation of a electrochemical bath used for electrochemical formation of the first silicon oxide layer onto the device shown in FIG. 1B and for electrochemical formation of the second silicon oxide layer on the device shown in FIG. 1E.

Referring to FIG. 5, the electrochemical formation of the first silicon oxide layer 100 is achieved by placing the front side surface 14 on a surface 108 of an electrolyte 110 in an electrolyte bath 112. A series of rollers, only two of which are shown at 114 and 116, are placed in the bath 112 to support the front side surface 14 of the semiconductor wafer 12 and to transport the wafer 12 in the bath 112. A plurality of back side rollers 118, 120 and 122 are provided to contact the back side surface 16 of the wafer 12 and to transport the wafer 12 in the bath 112. The back side rollers 118, 120 and 122 are connected to an electrical circuit 124 comprising first and second conductors 126, 128 a current meter 130, a voltage source 132, and an electrode 134. The electrode 134 is positioned in the electrolyte 110 and is connected by the second conductor 128 to the voltage source 132. The back side rollers 118, 120 and 122 are connected by the first conductor to the current meter 130 and the current meter is connected to the voltage source 132 such that a series circuit is formed. The electrolyte 110 may comprise a composition of approximately 0.5 grams of $NaNO_3$, 3 grams of $H_2O$ and 100 ml of $CH_3OH$, and thus is conductive.

Desirably, the contact resistance between the back side surface 16 and the back side rollers 118, 120 and 122 is kept small. A thin layer of aluminum (not shown) may be previously evaporated onto the back side surface 16 to provide a low contact resistance between the back side surface and the back side rollers 118, 120 and 122.

The electrode 134 can be made from platinum, graphite, stainless steel, aluminum or other material that provides sufficiently low resistive electrical contact with the back side surface 16.

To electrochemically form the first silicon oxide layer 100, the voltage source 132 is set to apply a voltage in the range of between about 20 volts to about 500 volts between the back side rollers 118, 120 and 122 and the electrode 134. This causes the water in the electrolyte to be decomposed into ions of hydrogen and oxygen. A migration of oxygen ions in the electrolyte 110 results in the electrochemical oxidation of silicon oxide to the unmasked areas 34 of the front side surface 14 of the wafer 12 while migration of hydrogen ions results in reduction of the electrode 134. Depending on the electrolyte composition, the process of electrochemical oxidation may occur at relatively low temperatures that may be below 100° C.

Silicon oxide is an insulator having a resistance that depends upon the thickness of the silicon oxide that is anodically formed in the unmasked areas 34. Thus, as the first silicon oxide layer is formed and grows, the resistance its presents to the electrical circuit increases and thus the current drawn from the voltage source 132 gradually decreases. Therefore, the voltage provided by the voltage source 132 may need to be increased to maintain growth of the silicon oxide layer in the unmasked areas 34 to achieve a desired thickness.

Typically, the dead zone 20 has a thickness of about 30 nm to about 100 nm and, therefore, it is desirable to control the voltage provided by the voltage source 132 to ensure that the silicon oxide layer 100 is formed to a depth corresponding the thickness of the dead zone.

The first silicon oxide layer 100 formed in the unmasked areas 34 effectively transforms the portions of the emitter beneath the unmasked areas 34 of the first surface into portions of silicon oxide that are herein referred to as the first silicon oxide layer. Since the thickness of the first silicon oxide layer 100 is controlled by adjusting the voltage of the voltage source 132 to cause the first silicon oxide layer to extend into the emitter 25 at least as far as the dead zone 20, the first silicon oxide layer occupies the dead zone under the unmasked areas 34 of the front side surface 14 leaving the portion of the emitter between the first silicon oxide layer and the junction 18 that has a doping profile comprising a decreasing concentration of dopant. Sheet resistance of this zone of decreasing dopant concentration depends on the thickness of this zone and may vary in the range from about 80 ohms per square to about 140 ohms per square. Accordingly, the first oxide layer may be extended inside this zone of decreasing dopant concentration in order to produce the emitter with the desired sheet resistance.

In the embodiment shown, while the first silicon oxide layer occupies the dead zone, and leaves the zone of decreasing dopant concentration therebeneath intact, the adjacent masked areas that are covered by the protective strips 36 continue to have a sheet resistivity of about 40 ohms per square to about 50 ohms per square.

Figure 1D:
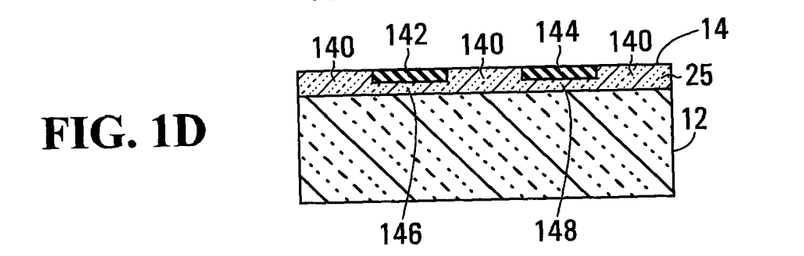
FIG. 1D which is a schematic representation of the device of FIG. 1C after removal of protective strips thereon.

Referring back to FIG. 1, in particular FIG. 1D, the next step in the process is to remove the mask 30, which involves removing the protective strips 36. This may be done using an organic solvent such as chloroform or other chlorine-based organic solvent to dissolve the protective strips 36. This leaves the emitter 25 with areas 140 that are heavily doped and which have a sheet resistivity of about 40 ohms per square to about 50 ohms per square separated by portions of the first silicon oxide layer 142, 144 and small shallow lightly doped portions 146, 148 having a sheet resistivity of up to about 140 ohms per square. Generally, the front side surface 14 is flat planar.

Figure 1E:
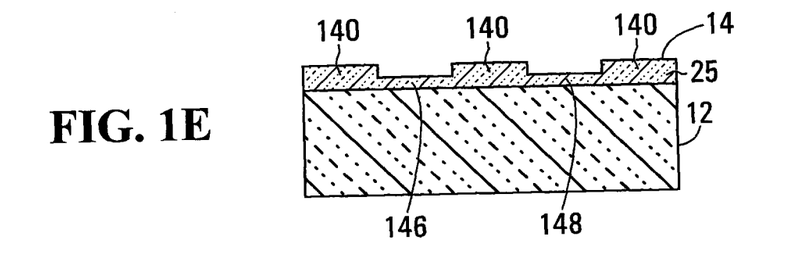
FIG. 1E which is a schematic representation of the device shown in FIG. 1D after etchback of a first silicon oxide layer of the device shown in FIG. 1D.

Referring to FIG. 1E, the next step in the process is to etch-back the first silicon oxide layer 100 until substantially all of the first silicon oxide layer is removed. This involves the use of known etch-back processes such as those involving the immersion of the front side surface 14 of the wafer 12 into hydrofluoric acid (HF), which results in selective dissolving of the first silicon oxide layer 100 while leaving the adjacent highly doped portions 140 of the emitter 25 virtually unetched except for a very thin native layer of silicon oxide of about 1 nm thickness that is usually present on any silicon crystalline surface intact. Thus, the highly doped portions 140 are adjacent to, and stand above, the lightly doped portions 146 and 148, for example.

Figure 1F:
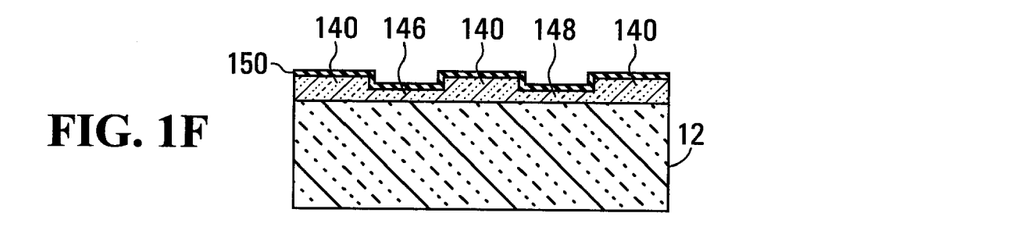
FIG. 1F which is a schematic representation of the device shown FIG. 1E after formation of a second silicon oxide layer thereon.

The next step in the process is to electrochemically form a second silicon oxide layer 150 on the front side surface 14 after the above step of etching-back, to cause the second silicon oxide layer to have sufficient thickness to passivate the highly doped portions 140 and the lightly doped portions 146 and 148. To electrochemically form the second silicon oxide layer, the wafer may be placed in the electrolytic bath 112 shown in FIG. 5 and the voltage source 132 may be adjusted to grow the second layer of silicon oxide 150 on the highly doped portions 140 and the lightly doped portions 146, 148. Referring to FIG. 1F the second silicon oxide layer 150 may be formed to a thickness of between about 1 nm to about 30 nm, which is sufficient to passivate the outer surfaces of the highly doped areas 140 and the lightly doped portions 146, 148.

Figure 1G:
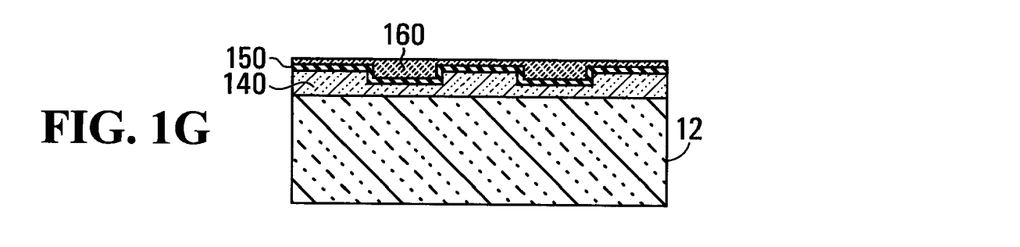
FIG. 1G which is a schematic representation of the device shown in FIG. 1F after deposition of an anti-reflective coating thereon.

Still referring to FIG. 1, specifically FIG. 1G, the next step in the process is to form an antireflective coating such as silicon nitride ($SiN_4$) 160 on the second silicon oxide layer 150. The $SiN_4$ anti-reflective coating may be applied using plasma-enhanced chemical vapor deposition or other known methods.

Figure 1H:
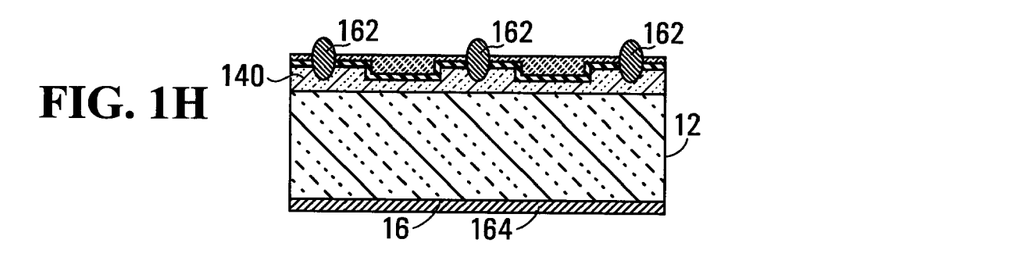
FIG. 1H which is a schematic representation of the device shown in FIG. 1G with electrical contacts formed thereon.

Referring to FIG. 1H, the next step in the process is to form electrical contacts on the front and back side surfaces 14 and 16 respectively. The contacts 162 on the front side surface 14 are formed using conventional screen-printing technology which involves alignment of screen-printing screens such that contact-forming paste is positioned on the highly doped areas 140. Alternative methods such as metal plating may be used to form contacts in the front side surface 14. Contacts 164 may be formed in the back side surface 16 using conventional screen-printing methods, or laser firing methods or aluminum spattering with sintering. The positioning of contacts on the back side surface 16 is not as critical as with the front side surface 14, but generally it is desirable to distribute the contacts uniformly across the back side surface.

Figure 1I:
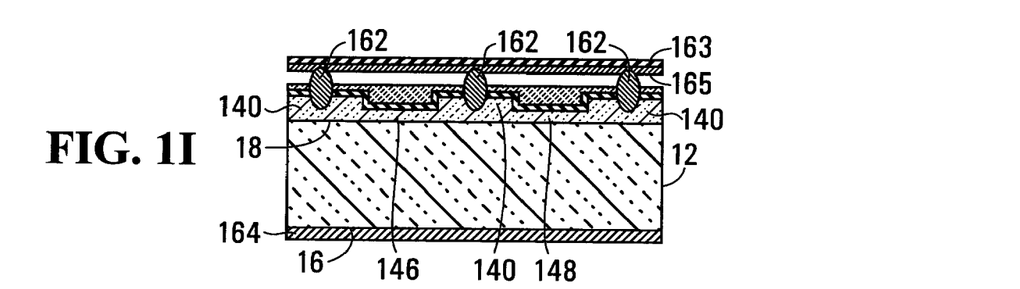
FIG. 1I which is a schematic representation of the device shown in FIG. 1H with a current collecting electrode secured thereto.

Referring to FIG. 1I, after contacts have been formed on the front and back side surfaces 14 and 16, an electrode 163 such as described in PCT Application No. PCT/CA2003/001278 may be applied to the front side surface such that conductors 165 on the electrode make ohmic contact with the contacts 162 on the front side surface to collect current therefrom and provide current to an external electrical circuit.

Referring to FIG. 6, a method of forming a selective emitter in a crystalline semiconductor wafer 200 by employing silicon oxide as a diffusion barrier is shown generally at 206. The first step of the process is shown in FIG. 6A and in this step, a mask 208 is formed on a front side surface 202 of the wafer 200 to create masked areas 210 and unmasked areas 212 on the front side surface. The mask 208 may be formed in the same manner as described in connection with FIG. 1B. In particular, protective strips 214, the same as those described as item 36 above, are screen-printed onto the front side surface 202.

Figure 6A:
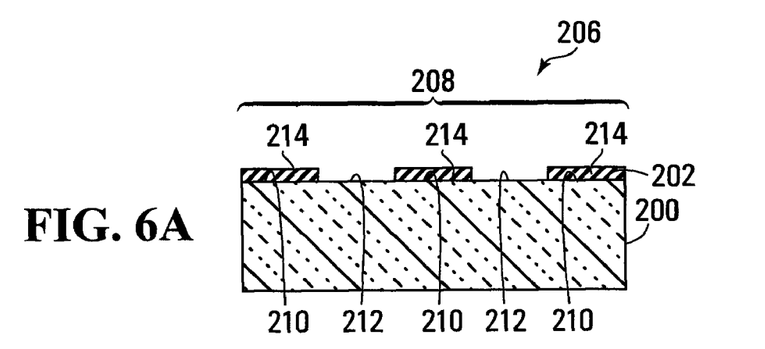
Figure 6B:
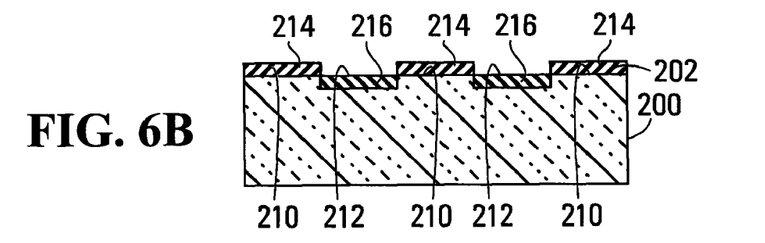
FIG. 6B which shows the device shown in FIG. 6A after electrochemical formation of a first oxide layer thereon.

Referring to FIG. 6B, the next step in the process is to form a first silicon oxide layer 216 in the unmasked areas 212 of the front side surface 202. This first silicon oxide layer 216 is formed in the same way as described above in connection with FIG. 5. The first silicon oxide layer 216 in this embodiment is formed to have a thickness of between about 1 nm to about 500 nm, such that the thickness is approximately the same as the thickness of a dead zone that will be produced in the wafer during a subsequent diffusion step described below.

Figure 6C:
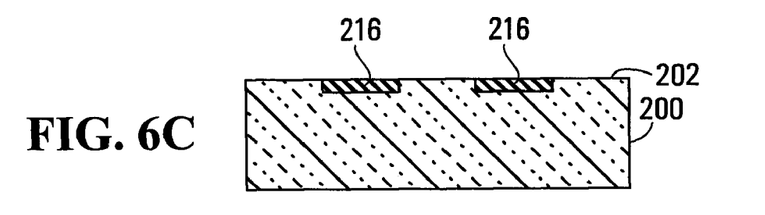
FIG. 6C which shows the device shown in FIG. 6B after protective strips thereof have been removed.

The next step in the process is shown in FIG. 6C and involves the removal of the protective strips 214 in the same manner as described above in connection with FIG. 1D. Essentially, an organic solvent is used to dissolve the protective strips 214 to leave a generally flat planer front side surface 202 on the wafer 200.

Figure 6D:
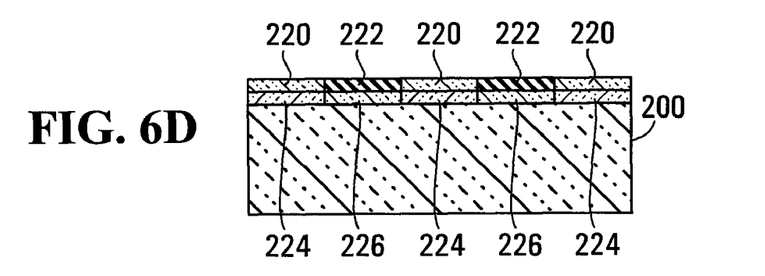
FIG. 6D which shows the device shown in FIG. 6C after exposure to a doping process in which an n-type material is diffused into a front surface of the device shown in FIG. 6 to form an emitter having areas of high dopant concentration and areas of low dopant concentration.

Referring to FIG. 6D, the next step in the process is to diffuse a dopant through the previously masked areas 210 of the front side surface 202 and through the first silicon oxide layer 216 such that the previously masked areas 210 and the first silicon oxide layer 216 have a dead zone 220 and 222 respectively in which the diffused dopant concentration is relatively constant, and have a zone 224 and 226 respectively in which the diffused dopant concentration is decreasing.

Figure 6E:
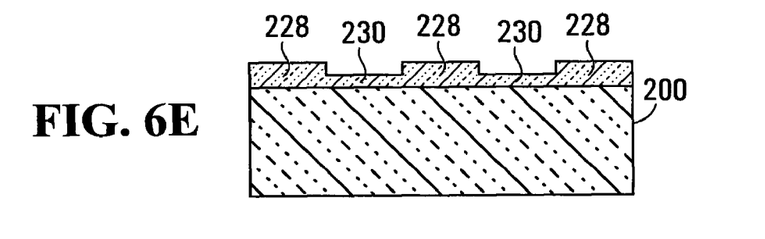
FIG. 6E which is a schematic representation of the device shown in FIG. 6D after etchback of a first silicon oxide layer of the device shown in FIG. 6D.
Figure 6F:
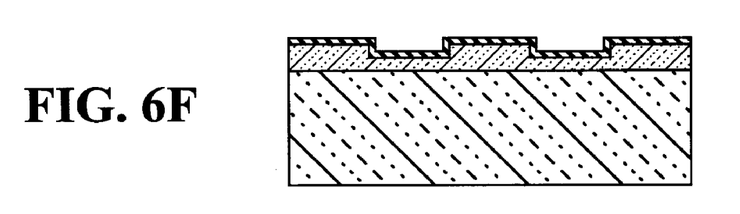
FIG. 6F which is a schematic representation of the device shown FIG. 6E after formation of a second silicon oxide layer thereon.
Figure 6G:
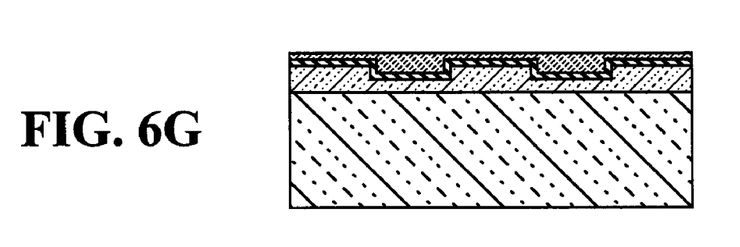
FIG. 6G which is a schematic representation of the device shown in FIG. 6F after deposition of an anti-reflective coating thereon.
Figure 6H:
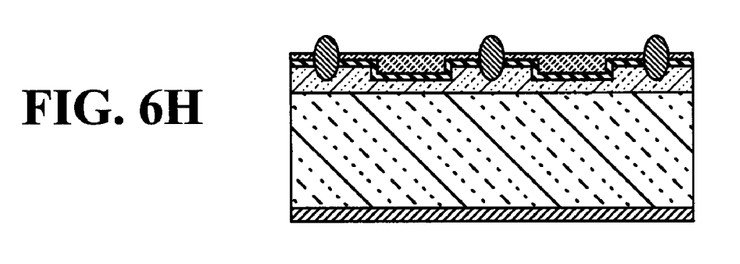
FIG. 6H which is a schematic representation of the device shown in FIG. 6G with electrical contacts formed thereon.

Referring to FIG. 6E, the next step in the process is to etch-back the first silicon oxide layer 216 until substantially all of the first silicon oxide layer is removed and this is done in the same manner as described above in connection with FIG. 1E. In essence, an acid such as hydrofluoric acid (HF) is used to selectively etch the first silicon oxide layer 216 leaving areas of high dopant concentration 228 and areas of low dopant concentration 230.

The next steps in the process are shown in FIGS. 6F through 6I and are identical to the steps shown in FIGS. 1F through 1I above.

Figure 6I:
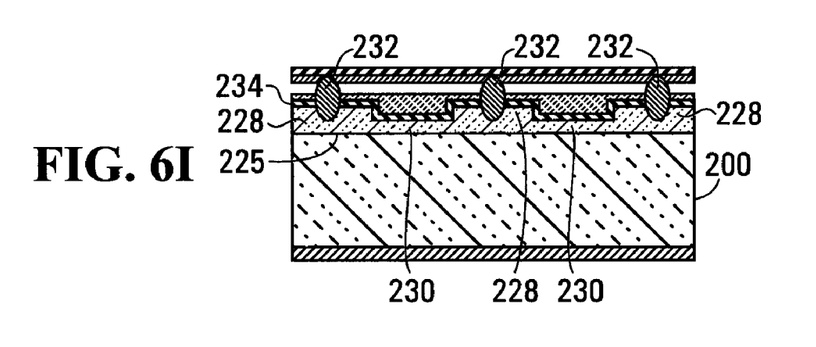
FIG. 6I which is a schematic representation of the device shown in FIG. 6H with a current collecting electrode secured thereto.

Referring to FIGS. 1I and 6I, the areas of high dopant concentration 140 and 228 in respective embodiments have a thickness greater than the thickness of areas of low dopant concentration 146, 148 and 230 in respective embodiments. The areas of low dopant concentration 146, 148 and 230 are areas of higher quantum efficiency, particularly in the blue spectral region which causes the resulting PV cell to be responsive to a wider bandwidth of light energy, which increases the efficiency of the PV cell over PV cells having emitters with greater thickness. The areas of high doping concentration 140 and 228, have greater thickness to accommodate the electrical contacts 162 and 232 (in respective embodiments) which avoids diffusion of the electrical paste, forming the electrical contacts, through the semiconductor junction 18 and 225 and provide the bulk necessary to support the electrical contacts.

By electrochemically forming the first silicon oxide layer 100 and 216 in respective embodiments and the second silicon oxide layer 150 and 234 in respective embodiments, the thickness of these layers can be carefully controlled to cause, for example, the first silicon oxide layer 100 and 216 to extend into the emitter 25, only as far as the dead zone, as in the embodiment shown in FIG. 1 or only as far as the dead zone, as described in connection with the embodiment described in FIG. 6. Through the use of electrochemical formation methods, as described herein and the etching methods described herein, emitter thickness can be selectively and carefully controlled to provide relatively thick emitter portions to support electrical contacts in the front side surface and relatively thin emitter portions to provide for better photovoltaic energy production over a wider bandwidth of light.

One of the advantages of using electrochemical oxidation for the formation of silicon oxide layers is that it may be performed at relatively low temperatures, e.g. below 100° C. This opens the possibility to employ this method for producing not only silicon monocrystalline but also for producing multicrystalline PV cells.

While specific embodiments of the invention have been described and illustrated, such embodiments should be considered illustrative of the invention only and not as limiting the invention as construed in accordance with the accompanying claims.

What is claimed is:

1. A method of forming a selective emitter in a photovoltaic crystalline silicon semiconductor wafer having front and back side surfaces, a junction between said front and back side surfaces, and an emitter between said junction and said front side surface wherein said emitter has a diffused dopant concentration profile such that said emitter has a dead zone immediately underneath said front side surface in which said diffused dopant concentration is relatively constant and a zone of decreasing dopant concentration adjacent the dead zone in which said diffused dopant concentration is decreasing, the method comprising:
    forming a mask on said front side surface, to create masked and unmasked areas on said front side surface;
    electrochemically forming a first silicon oxide layer at said unmasked areas of said front side surface such that said silicon oxide layer extends into said emitter at least as far as said dead zone;
    removing said mask;
    etching back said first silicon oxide layer until substantially all of said first silicon oxide layer is removed; and
    electrochemically forming a second silicon oxide layer on the front side surface after said etching back, said second silicon
    oxide layer having sufficient thickness to passivate said front side surface.

2. The method of claim 1 wherein electrochemically forming at least one of said first silicon oxide layer and said second silicon oxide layer comprises placing said front side surface in electrical contact with a surface of an electrolyte while applying an electric potential between said electrolyte and said back side surface of said wafer until a current through said wafer meets a criterion.

3. The method of claim 2 wherein electrochemically forming at least one of said first silicon oxide layer and said second silicon oxide layer comprises applying said electric potential until said current through the wafer is less than a reference value.

4. The method of claim 3 wherein electrochemically forming said first silicon oxide layer comprises setting said reference value at a value corresponding to a thickness of said silicon oxide layer corresponding to approximately a thickness of at least said dead zone.

5. The method of claim 2 wherein electrochemically forming at least one of said first silicon oxide layer and said second silicon oxide layer comprises varying said electric potential as said at least one of said first silicon oxide layer and said second silicon oxide layer grows.

6. The method of claim 5 wherein varying said electric potential comprises varying said electric potential between about 20 volts to about 500 volts.

7. The method of claim 1 wherein electrochemically forming said first silicon oxide layer comprises electrochemically forming said first silicon oxide layer until said first silicon oxide layer has a thickness of between about 1 nm to about 500 nm and wherein forming said second silicon oxide layer comprises electrochemically forming said second silicon oxide layer until said second silicon oxide layer has a thickness of between about 1 nm to about 30 nm.

8. A method of preparing a photovoltaic crystalline silicon semiconductor wafer for use as a photovoltaic cell comprising executing the method of claim 1 and further comprising applying an antireflective coating to said front side surface.

9. The method of claim 8 further comprising forming electrical contacts on said front and back side surfaces, wherein said electrical contacts formed in said front side surface are formed in areas of said semiconductor wafer that were covered by said mask and said electrical contacts formed in said back side surface are formed uniformly throughout said back side surface.

10. The method of claim 1 wherein forming said mask comprises printing a paste onto said front side surface.

11. The method of claim 10 wherein printing said paste comprises printing said paste into lines.

12. A method of producing a photovoltaic cell comprising executing the method of claim 1 and further comprising applying an antireflective coating to said front side surface.

13. A method of producing a photovoltaic cell comprising executing the method of claim 8 and further comprising forming electrical contacts on said front and back side surfaces, wherein said electrical contacts formed in said front side surface are formed in areas of said emitter that were covered by said mask and said electrical contacts formed in said back side surface are formed uniformly throughout said back side surface.

14. A method of forming a selective emitter in a crystalline silicon semiconductor wafer having front and back side surfaces, the method comprising:
    forming a mask on said front side surface, to create masked and unmasked areas on said front side surface;
    electrochemically forming a first silicon oxide layer in said unmasked areas of said front side surface;
    removing said mask;
    diffusing a dopant through the previously masked areas of said front side surface and through said first silicon oxide layer such that said previously masked areas and said first silicon oxide layer have a dead zone in which said diffused dopant concentration is relatively constant and a zone of decreasing dopant concentration adjacent the dead zone in which said diffused dopant concentration is decreasing;
    etching back said first silicon oxide layer until substantially all of said first silicon oxide layer is removed; and
    electrochemically forming a second silicon oxide layer on said front side surface after said etching back, said second silicon oxide layer having sufficient thickness to passivate said front side surface.

15. The method of claim 14 wherein electrochemically forming at least one of said first silicon oxide layer and said second silicon oxide layer comprises placing said front side surface in electrical contact with a surface of an electrolyte while applying an electric potential between said electrolyte and said back side surface of said wafer until a current through said wafer meets a criterion.

16. The method of claim 15 wherein electrochemically forming at least one of said first silicon oxide layer and said second silicon oxide layer comprises applying said electric potential until said current through the wafer is less than a reference value.

17. The method of claim 16 wherein electrochemically forming said first silicon oxide layer comprises setting said reference value at a value corresponding to a thickness of said first silicon oxide layer corresponding to approximately a thickness of at least said dead zone.

18. The method of claim 15 wherein electrochemically forming at least one of said first silicon oxide layer and said second silicon oxide layer comprises varying said electric potential as said at least one of said first silicon oxide layer and said second silicon oxide layer grows.

19. The method of claim 14 wherein varying said electric potential comprises varying said electric potential between about 20 volts to about 500 volts.

20. The method of claim 14 wherein electrochemically forming said first silicon oxide layer comprises electrochemically forming said silicon oxide layer until said first silicon oxide layer has a thickness of between about 1 nm to about 500 nm and wherein forming said second silicon layer comprises electrochemically forming said second silicon oxide layer until said second silicon oxide layer has a thickness of between about 1 nm to about 30 nm.

21. A method of preparing a photovoltaic crystalline silicon semiconductor wafer for use as a photovoltaic cell, the method comprising the method of claim 14 and further comprising forming an antireflective coating on said front side surface.

22. The method of claim 21 further comprising forming electrical contacts on said front and back side surfaces, wherein said electrical contacts formed in said front side surface are formed in areas of said semiconductor wafer that were covered by said mask and said electrical contacts formed in said back side surface are formed uniformly throughout said back side surface.

23. The method of claim 14 wherein forming said mask comprises printing a paste onto said front side surface.

24. The method of claim 23 wherein printing said paste comprises printing said paste into lines.

25. A method of adapting a semiconductor wafer for use in photovoltaic power generation, the method comprising the method of claim 14 and further comprising forming an antireflective coating on said front side surface.

26. The method of claim 25 further comprising forming electrical contacts in said front and back side surfaces, wherein said electrical contacts formed in said front side surface are formed in areas of said semiconductor wafer that were covered by said mask and said electrical contacts formed in said back side surface are formed uniformly throughout said back side surface.

27. A method of producing a photovoltaic cell comprising executing the method of claim 12 and further comprising forming electrical contacts on said front and back side surfaces, wherein said electrical contacts formed in said front side surface are formed in areas of said emitter that were covered by said mask and said electrical contacts formed in said back side surface are formed uniformly throughout said back side surface.

* * * * *